(12) United States Patent
Beraud

(10) Patent No.: US 9,433,116 B2
(45) Date of Patent: Aug. 30, 2016

(54) CONTROL AND DISPLAY MODULE FOR MOTOR VEHICLES

(75) Inventor: Henry Beraud, Vincennes (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 266 days.

(21) Appl. No.: 14/008,797

(22) PCT Filed: Mar. 25, 2012

(86) PCT No.: PCT/FR2012/000116
§ 371 (c)(1),
(2), (4) Date: Oct. 14, 2013

(87) PCT Pub. No.: WO2012/131192
PCT Pub. Date: Oct. 4, 2012

(65) Prior Publication Data
US 2014/0029207 A1    Jan. 30, 2014

(30) Foreign Application Priority Data
Mar. 31, 2011    (FR) ..................................... 11 00973

(51) Int. Cl.
*G06F 1/16*    (2006.01)
*H05K 5/00*    (2006.01)
*H05K 7/00*    (2006.01)
*H05K 7/02*    (2006.01)
(Continued)

(52) U.S. Cl.
CPC ................. *H05K 7/02* (2013.01); *B60K 37/06* (2013.01); *G06F 3/041* (2013.01); *B60K 35/00* (2013.01); *B60K 2350/1024* (2013.01); *B60K 2350/1028* (2013.01)

(58) Field of Classification Search
CPC .......... B60K 37/06; B60K 2350/1024; B60K 35/00; G06F 3/041; H05K 7/02
USPC ................................ 361/728, 679, 26, 679.3
See application file for complete search history.

(56) References Cited

U.S. PATENT DOCUMENTS 5,494,447 A * 2/1996 Zaidan .................. G06F 1/1618
16/361
5,900,848 A * 5/1999 Haneda ................... G06F 1/162
345/1.1

(Continued)

FOREIGN PATENT DOCUMENTS

WO    2011/010009 A1    1/2011

OTHER PUBLICATIONS

International Search Report for corresponding International Application No. PCT/FR2012/000116, mailed Jun. 6, 2012 (4 pages).

*Primary Examiner* — Bernard Rojas
(74) *Attorney, Agent, or Firm* — Osha Liang LLP

(57) ABSTRACT

The invention relates to a control and display module for motor vehicles, comprising: a display screen for displaying data; a touchpad for entering user commands, said touchpad at least partially overlapping the display screen; and a casing in which the display screen and the touchpad are housed, said casing comprising a front frame. The module is characterized in that: the casing includes an internal rim protruding between the display screen and the touchpad, which rim maintains the display screen in position in the casing; and the control and display module also comprises a seal including a first portion inserted between the internal rim of the casing and the display screen and a second portion extending beyond the internal rim towards the center of the display screen.

16 Claims, 3 Drawing Sheets

(51) Int. Cl.
*B60K 37/06* (2006.01)
*G06F 3/041* (2006.01)
*B60K 35/00* (2006.01)

(56) References Cited

U.S. PATENT DOCUMENTS

| | | | | |
|---|---|---|---|---|
| 6,262,885 B1 * | 7/2001 | Emma | ................... | G06F 1/1618 361/679.05 |
| 6,266,236 B1 * | 7/2001 | Ku | .......................... | G06F 1/162 312/223.1 |
| 6,351,372 B1 * | 2/2002 | Kim | ...................... | G06F 1/1616 312/208.4 |
| 7,639,479 B2 * | 12/2009 | Chuang | ................... | G06F 1/162 361/679.06 |
| 8,248,772 B2 * | 8/2012 | Dai | ........................ | G06F 1/162 361/679.02 |
| 2008/0246741 A1 * | 10/2008 | Hinata | .................. | G06F 3/045 345/173 |
| 2015/0248143 A1 * | 9/2015 | Huang | ................. | G06F 1/1616 361/679.11 |

* cited by examiner

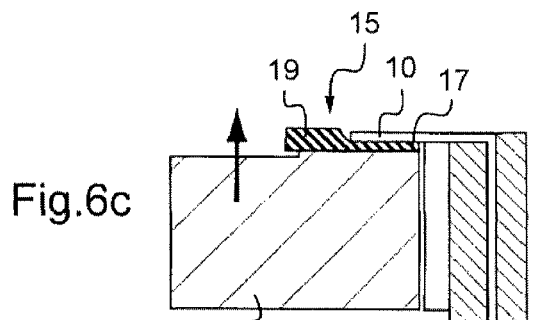
Fig.6c
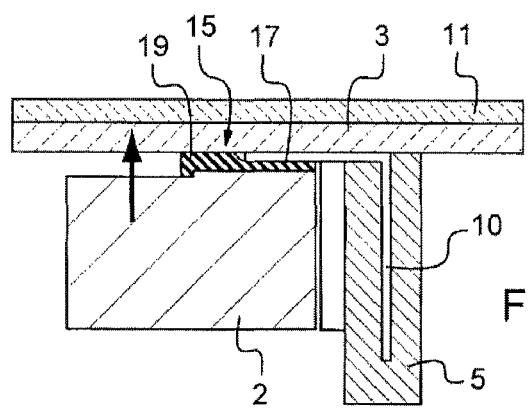
Fig.6d
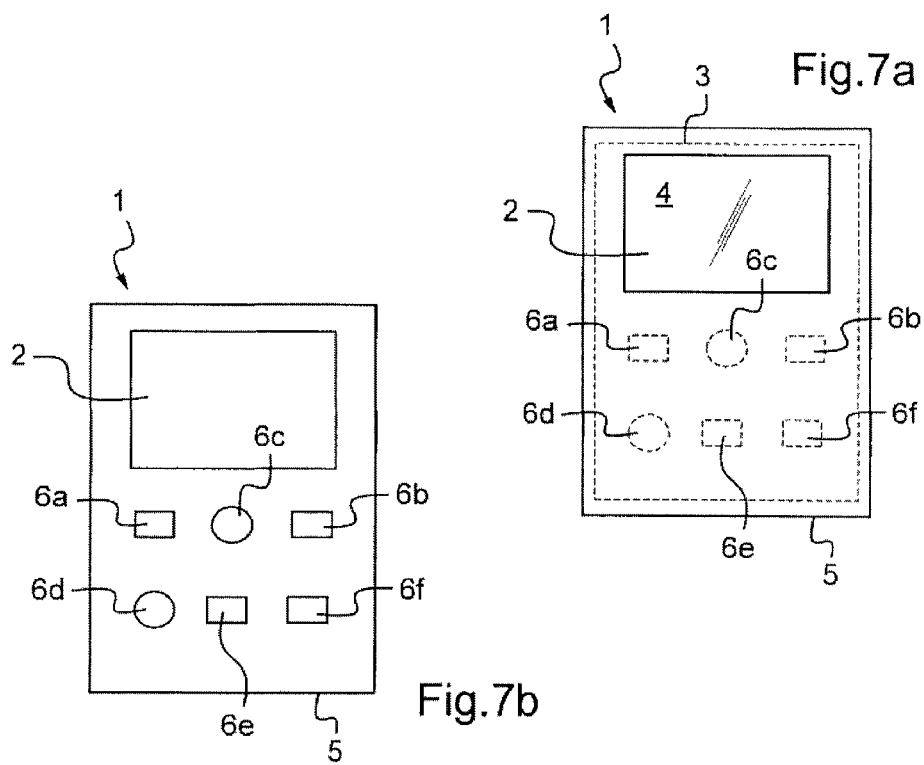
Fig.7a
Fig.7b

CONTROL AND DISPLAY MODULE FOR MOTOR VEHICLES

The present invention relates to the field of control and display modules with touch surface for motor vehicles. More particularly, such a module is advantageously applicable for the controls located in proximity to the driver, on the dashboard or the front console of a motor vehicle in order, for example, to control air conditioning functions, an audio system, a telephony system, a multimedia system or even a navigation system.

The motor vehicle control and display devices comprise a display screen for displaying information or command data. These screens may be covered, for example, by a transparent touchpad enabling commands to be input by the users of the vehicle. Some devices also comprise additional control knobs located in proximity to the screen.

The touchpad makes it possible to determine the coordinates of the touch of a user's finger by using, for example, resistive or capacitive technologies.

According to one exemplary technology, the resistive touchpad comprises a sandwich of a metalized deformable layer (such as a plastic film or a sheet of semi-flexible glass) facing a substrate of metalized glass, the deformable layer and the substrate being separated by insulating spacers. When the user presses on the touchpad, he or she deforms the layer which is lowered onto the glass substrate, creating an electrical contact. A voltage giving an analog representation of the position touched is then produced.

These touchpads can, for example, be films using a so-called ITO technology in which two layers, of which the opposite surfaces each have a transparent resistive conductive coating of indium tin oxide (ITO).

In the case of the capacitive touchpads, it is the more or less sustained approach of the finger or of a stylus which provokes an identifiable disturbance of the capacitive field and makes it possible to define the position of the finger or stylus on the pad.

Also, the touchpads are thin and fragile elements. It is therefore necessary to protect them, particularly from impacts which could be caused by the users.

Furthermore, the motor vehicle constructors these days seek to make the visible surfaces of vehicles more ergonomic to the user by proposing control modules with an appearance that is'smooth and uniform to the touch.

Moreover, in order to obtain a good display quality, the motor vehicle constructors are faced with differing constraints such as reducing the distance between the display screen and the touch surface or the seal-tightness between the display screen and the touchpad, particularly with respect to dust and moisture.

The invention therefore proposes an improved control and display module for motor vehicles that makes it possible to obtain a visible surface with an appearance that is smooth and uniform to the touch and that makes it possible to obtain a good display quality.

The object of the embodiments of the present invention is therefore a control and display module for motor vehicles comprising:
- a display screen for displaying data,
- a touchpad intended for the input of commands by a user, said touchpad at least partially overlaying said display screen,
- a casing in which said display screen and said touchpad are housed, said casing comprising a front frame, characterized in that:
- the casing has an internal rim protruding between the display screen and the touchpad, said internal rim holding the display screen in position in the casing, and in that,
- the control and display module also comprises a seal of which a first portion is inserted between the internal rim of the casing and the display screen and a second portion extends beyond the internal rim toward the center of the display screen.

According to another aspect of the present invention, the second portion of the seal extending beyond the internal rim links the display screen and the touchpad in a seal-tight manner.

According to another embodiment of the present invention, the control and display module comprises an additional seal, of which a first portion is inserted between the touchpad and the internal rim of the casing and a second portion extends beyond the internal rim toward the center of the display screen, the second portions of the seal and of the additional seal cooperating to link the display screen and the touchpad in a seal-tight manner.

According to an additional aspect of the present invention, the seal and/or the additional seal comprises a flexible material with closed cells.

According to an additional aspect of the present invention, the seal and/or the additional seal comprises a flexible material with open cells.

According to another aspect of the present invention, the seal and/or the additional seal comprises a polyethylene foam.

According to an additional aspect of the present invention, the seal and/or the additional seal comprises an elastomer of ethylene-propylene-diene monomer (EPDM) type.

According to an additional aspect of the present invention, the seal and/or the additional seal is bi-adhesive.

According to another aspect of the present invention, the length of the first portion and the second portion of the seal is between 2 and 5 millimeters.

According to an additional aspect of the present invention, the first portion of the seal and/or of the additional seal is compressed by at least 50% of its initial thickness without stress.

According to another embodiment of the present invention, the seal and/or the additional seal is two-staged so that the first and the second portions of the seal and/or of the additional seal have different thicknesses.

According to another aspect of the present invention, said module also comprises a protective film fixed to the outer edges of the front frame of the casing and behind which the touchpad is fixed.

According to an additional aspect of the present invention, the fixing between the protective film and the touchpad is produced by gluing.

According to an additional aspect of the present invention, the protective film comprises a local opaque tint to mask at least the internal rim of the casing from the user.

According to another aspect of the present invention, the touchpad is a capacitive pad.

According to an additional aspect of the present invention, the internal rim of the casing is formed by a metallic insert fixed to the casing.

Other features and advantages of the invention will become apparent from the description which will now be given, with reference to the appended drawings which represent, by way of nonlimiting indication, one possible embodiment thereof.

In these drawings:

FIGS. 6a to 6d represent diagrams of different steps of assembly of the elements of a first embodiment of a control and display module according to the present invention;

FIGS. 7a and 7b represent schematic front views of the control and display module according to an alternative embodiment of the present invention.

In these drawings, the same reference numbers represent the same elements.

Figure 1:
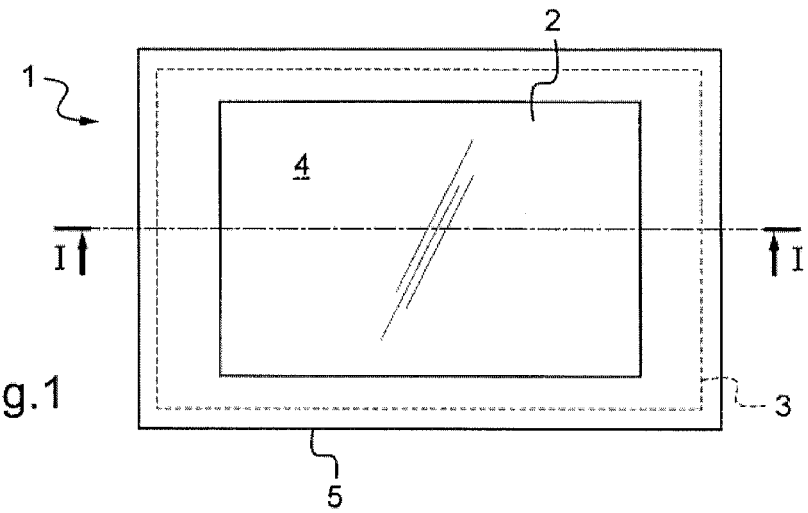
FIG. 1 represents a diagram of a front view of the control and display module according to one embodiment of the present invention.

FIG. 1 represents a schematic front view of a control and display module 1 for motor vehicles, the module being arranged substantially vertically in the vehicle. The control and display module 1 can be fixed in proximity to the user, for example on the center console of the vehicle or on the dashboard (not represented) in order, for example, to control air conditioning functions, an audio system, a telephony system, a multimedia system or even a navigation system.

In this figure, the control and display module 1 comprises a display screen 2, for displaying information or command data, at least one touchpad 3 (represented by dotted lines) and has a front control surface 4 for the input of commands by a user, the front control surface 4 being at least overlaid on the display screen 2, and a casing 5 in which the display screen 2 and the touchpad 3 are housed. In the first example, presented in FIG. 1, the touchpad 3 covers the display screen 2 by extending over the sides of the screen 2.

The touchpad 3 is transparent to be placed in front of the display screen 2 and to serve as input means. The touchpad 3 determines the coordinates of the point where the user presses with his or her finger on the front control surface 4, in the plane of the pad 3. The touchpad 3 comprises, for example, resistive or capacitive properties. The movement or the touch of the finger of a user provokes the creation of a signal that varies with the location and the movement of his or her finger in contact and according to the extent over this surface.

According to one embodiment, the touchpad 3 uses the ITO (indium tin oxide) technology. More specifically, such a pad comprises two layers, of which the opposite surfaces each have a transparent resistive conductive coating of indium tin oxide (ITO). These surfaces are separated from one another by separators in the rest state.

When the front control surface 4 linked to the touchpad is touched, an electrical contact is made between the two opposing surfaces and produces a voltage. The voltage level detected is representative of the coordinates of the touch on the front control surface 4.

Moreover, the display screen 2 is, for example, a TFT screen (using the "Thin Film Transistor" technology), for example a 7-inch screen (or 17.78 cm screen).

The display screen 2 and the touchpad 3 thus allow for the input of commands and the display of corresponding data.

Figure 2:
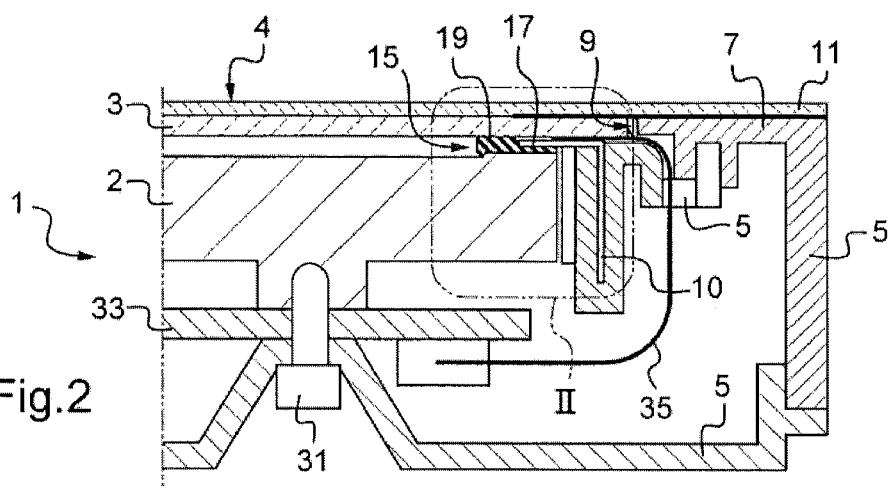
FIG. 2 represents a diagram of a cross-sectional view of a control and display module according to a first embodiment of the present invention along a cut line I-I.

FIG. 2 represents a cross-sectional view from above of a part of the control and display module 1 making it possible to better distinguish the positions of the different elements. Thus, the control and display module 1 comprises a casing 5 that has a front frame 7 having an opening 9 and an internal rim 10. The casing 5 is, for example, made of plastic or rigid elastomer.

The display screen 2 is positioned inside the casing 5 and oriented toward the front control surface 4. The touchpad 3 is positioned at the level of the opening 9 of the front frame 7 and at least partially overlays the display screen 2. The touchpad 3 is fixed behind a protective film 11, the outer surface of which constitutes the front control surface 4.

The fixing of the touchpad 3 to the protective film 11 is produced by gluing using an "optical glue" which makes it possible to guarantee a good transparency quality. The protective film 11, for its part, is fixed onto the outer surface of the front frame 7. The fixing is produced by gluing the protective film 11 so that it is "taut" over the front frame 7.

The protective film 11 is, for example, a thin semi-rigid film of polycarbonate which may be laminated, decorated by screen printing and held on the front frame 7 by gluing or by overmolding. Furthermore, this protective film 11 may be covered by a polarizing film so as to limit the brightness effects as well as fingerprints. A scratchproof lacquer may also be added to the outer surface of the protective film.

Moreover, the display screen 2 is, on the one hand, fixed to the casing 5 from the rear, for example by fixing screws 31 situated at the rear of the casing 5, that is to say on the side opposite the front control surface 4 and, on the other hand, held by the front at the level of the periphery of the display screen 2 by the internal rim 10 protruding between the display screen 2 and the touchpad 3.

In order to limit its thickness, the internal rim 10 of the casing 5 is formed by a metallic insert fixed to the casing 5, for example an insert made of stainless steel or other steel which may be fixed by overmolding, gluing, snap riveting, riveting, screwing or snap fitting to the casing 5. The casing 5 is, for example, overmolded over the metallic insert 10.

Furthermore, in order to ensure the seal-tightness, particularly with respect to the possible ingress of dust or moisture between the display screen 2 and the touchpad 3, the control and display module 1 also comprises at least one seal.

According to a first embodiment represented in FIG. 2, the control and display module 1 comprises a uniform seal 15. A first portion 17 of the seal 15 is inserted between the internal rim 10 formed by the metallic insert and the display screen 2 which makes it possible to hold the display screen 2 in position while protecting it from contact with the metallic insert 10 and a second portion 19 of the seal 15 extends beyond the internal rim toward the center of the display screen 2. In this case, the seal 15 is a strongly compressible open foam such that the first portion 17 of the seal 15 is compressed so as to reduce its thickness by at least 50% compared to its initial thickness without stress, so that the second portion 19 ensures the seal-tightness between the display screen 2 and the touchpad 3. The first portion is, for example, compressed by 70% and the second portion compressed by 20%. This strong compression makes it possible to obtain a second portion 19 of the seal 15 for which the thickness is greater than the thickness formed by the first portion 17 and the internal rim 10 combined and thus makes it possible to fill the gap located between the internal rim 10 and the touchpad so as to ensure the seal-tightness between the display screen 2 and the touchpad 3.

This type of seal 15 can be manufactured from an elastomer made of foam with cells of ethylene-propylene-diene monomer (EPDM) type, such as a polyethylene. In practice, these materials offer the advantage of having a low cost price and being non-flammable which is required in the automobile industry.

Furthermore, the seal 15 makes it possible to make up any tolerance differences regarding the thicknesses of the different elements of the control and display module 1 and to protect the display screen 2 from vibrations or impacts. It should also be noted that strong temperature variations can occur in the control and display module 1, notably because of the light sources present which can cause the various elements of the control and display module 1 to expand, the seal 15 making it possible to hold the elements in place and limit the stresses, particularly on the display screen 2 and the touchpad 3 which are relatively fragile elements.

The display screen 2 is therefore held on the one hand by the fixing screws 31 and on the other hand by the internal rim 10 embodied by the metallic insert via the first portion 17 of the seal 15. This first portion 17 of the seal 15 can, for example, have a length of 2 to 5 mm, the second portion 19 of the seal 15 having a similar length of 2 to 5 mm. Furthermore, the seal 15 can have an initial thickness of 0.8 mm, the thickness being reduced to 0.3 mm after compression in the first portion 17. The thickness of the metallic insert 10 can also, for example, be 0.3 mm. The second portion 19 of the seal 15 makes it possible to join the display screen 2 and the touchpad 3 and also makes it possible to protect the touchpad 3 from any contact with the metallic insert 10. However, the compression of the second portion 19 of the seal 15 must be limited so as to limit the pressure exerted by the seal 15 on the touchpad 3, which could cause a deformation of the pad and of the protective screen 11 to which the pad is fixed, a deformation which could be sensed by sight and by touch by the user.

The thickness of the touchpad 3 is approximately 1.1 mm and the thickness of the protective film 11 is approximately 0.75 mm, so the overall distance between the display screen 2 and the front control surface 4 is approximately 3 mm (0.75+1.1+0.8+0.3), the display screen 2 having a 0.3 mm rim at its periphery.

Also, the control and display module 1 comprises a printed circuit 33 connected on the one hand to the display screen 2 and on the other hand to the touchpad 3 via a connecting ribbon cable 35 and making it possible to manage the electronic control and display signals.

The link between the connecting ribbon cable 35 and the touchpad 3 can be located on one or other of the faces of the touchpad 3 depending on the technology used, so that, when the link is made on the face in contact with the protective screen 11, the excess thickness created by the link between the connecting ribbon cable 35 and the touchpad 3 must be compensated, for example by a pool of glue or a transparent film to avoid any level difference that can be felt by the touch of a user.

Figure 3:
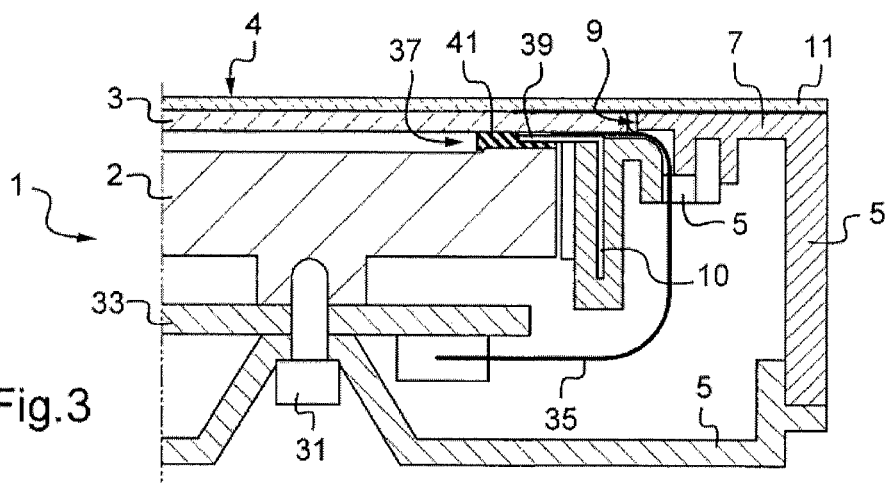
FIG. 3 represents a diagram of a cross-sectional view of a control and display module according to a second embodiment of the present invention, along a cut line I-I.

According to a second embodiment represented in FIG. 3, the seal is a two-stage seal 37 comprising two portions 39 and 41. The thinner first portion 39 is intended to be inserted between the internal rim 10 formed by the metallic insert and the display screen 2. The thicker second portion 41 is intended to extend beyond the internal rim 10 toward the center of the display screen 2 so as to be inserted between the display screen 2 and the touchpad 3, the two portions 39 and 41 of the two-stage seal 37 having the same functions as the two portions 17 and 19 of the seal 15 in the preceding embodiment. The two-stage seal 37 can be formed by an open foam or a closed foam since, in this embodiment, the first portion 39 of the two-stage seal 37 is not as compressed as in the preceding embodiment. Thus, the first portion 39 of the seal 37 can, for example, have a length of 2 to 5 mm and an initial thickness without stress of 0.5 mm without stress and 0.3 mm once compressed whereas the second portion 41 can have a length of 2 to 5 mm and an initial thickness without stress of 0.9 or 1 mm and of 0.8 mm approximately once compressed. The distance obtained between the display screen 2 and the front control surface 4 for this embodiment is the same as for the preceding embodiment. The other elements of the control and display module 1 of FIG. 3 are, moreover, identical to the preceding embodiment presented in FIG. 2.

Figure 4:
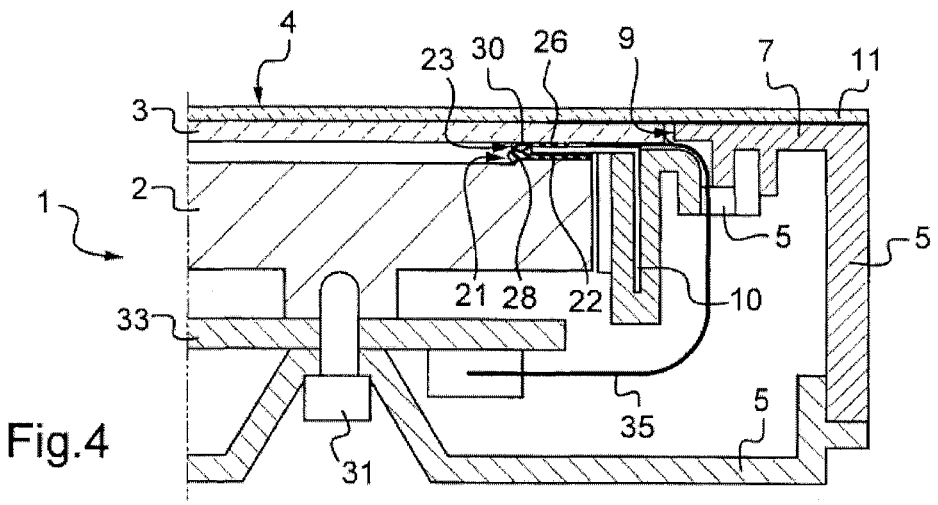
FIG. 4 represents a diagram of a cross-sectional view of a control and display module according to a third embodiment of the present invention, along a cut line I-I.

According to a third embodiment presented in FIG. 4, in addition to a seal 21 whose first portion 22 is inserted between the display screen 2 and the internal rim 10 of the casing 5, the control and display module 1 comprises an additional seal 23 of which the first portion 26 is inserted between the internal rim 10 of the casing 5 and the touchpad 3, the respective second portions 28 and 30 of the two seals 21 and 23 extending beyond the internal rim 10 toward the center of the 23 display screen 2. The combination of two seals 21 and thus makes it possible to create a seal-tightness between the display screen 2 and the touchpad 3. In this case, the two seals 21 and 23 have, for example, an initial thickness without stress of 0.5 or 0.6 mm, the first portion of the two seals having a length of 2 to 5 mm and a thickness of 0.3 mm once compressed and the second portion also having a length of 2 to 5 mm. The distance obtained between the display screen 2 and the front control surface 4 for this embodiment is almost the same as for the preceding embodiments. The other elements of the control and display module 1 of FIG. 4 are, moreover, identical to the preceding embodiments presented in FIGS. 2 and 3.

Also, it should be noted that the seal or seals of the embodiments previously described make it possible to mask the edge of the internal rim 10 formed by the metallic insert. In practice, the seal or seals may be colored, for example matt black, and thus mask the edge of the metallic insert 10 which then does not need to be painted, which reduces its cost.

Furthermore, in the different embodiments presented previously, the seal (respectively the seals) can be held by the pressure of the elements with which it is in contact, but the seal (respectively the seals) can also be a bi-adhesive seal, that is to say that its two faces comprise an adhesive substance making it possible to ensure the adhesion of the seal (respectively of the seals) with the surfaces of the elements with which it is in contact. According to an alternative embodiment, the seal may comprise an adhesive substance on only one of its faces, which makes it possible to hold the seal in place, notably during manufacture, the seal-tightness being ensured by the compression of the seal.

Figure 5:
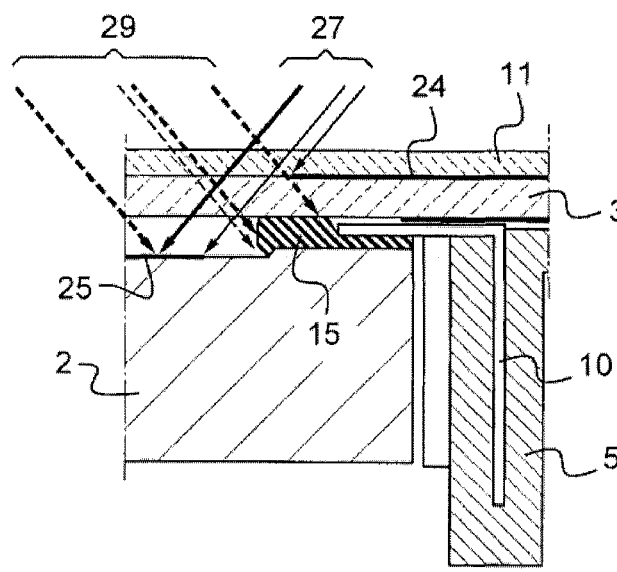
FIG. 5 represents a diagram of a detail II of FIG. 2 according to a first embodiment of the present invention, as well as the limit vision angles of the users.

Also, the technical elements of the control and display module 1 have to be masked from the field of view of the user in order to obtain a successful esthetic finish. For this, an opaque tint 24 (corresponding to a decorative film) is applied to the protective film 11 as presented in FIG. 5 schematically representing a detail II of FIG. 2. This tint 24 is applied to the face of the protective film 11 in contact with the touchpad 3 and the front frame 7 so as to be insensitive to the touch of a user and facilitate the application of any polarizing films or scratchproof lacquers to the outer face of the protective film 11.

Thus, FIG. 5 shows, by arrows 27 and 29, the vision angles of a user that are considered to be limit angles and corresponding to an angle of 40° relative to the normal to the display screen 2. The limit of application for the opaque tint 24 is determined in such a way that it does not mask the edge of the image displayed (identified by the line 25) on the display screen 2 from one side (arrows 27) which makes it possible to mask the metallic insert from the other side (arrows 29), the edge of the metallic insert 10 being masked by the seal 15. Thus, the user sees all of the image on the display screen but does not see the technical portions of the control and display module 1 and in particular the metallic insert 10. In addition, it should be noted that, instead of the opaque tint 24, a polarizing or smoked film also makes it possible to mask the generally grayish appearance of the seal and any glue.

In order to better understand the arrangement of the various elements of the control and display module 1, FIGS. 6a-6d represent different steps in the assembly of certain elements for the first embodiment in which the seal 15 has a uniform thickness over its entire length.

Figure 6A:
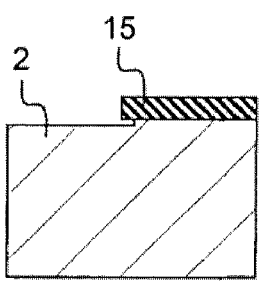

FIG. 6a represents the first step of the assembly method in which the seal 15 is positioned on the display screen 2 so as to be aligned with the rim of the display screen 2. In the case of a bi-adhesive seal, the seal 15 is glued to the display screen 2.

Figure 6B:
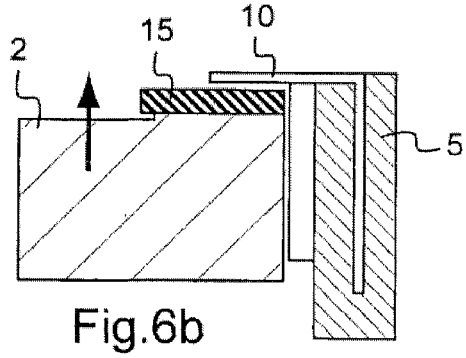

FIG. 6b represents the second step of the assembly method in which the display screen 2 is positioned in the casing 5 in such a way that the first portion 17 of the seal 15 situated on the outer side of the display screen 2 bears against the internal rim 10. In the case of a bi-adhesive seal, the seal is glued to the internal rim 10.

FIG. 6c represents the third step of the assembly method in which the display screen 2 is adjusted in depth in order to compress the first portion 17 of the seal 15 against the internal rim 10.

FIG. 6d represents the fourth step of the assembly method in which the assembly comprising the touchpad 3 and the protective film 11 is fixed onto the outer surface of the front frame 7 of the casing 5, which results in a slight compression of the second portion 19 of the seal 15 by the touchpad 3. In the context of a bi-adhesive seal, the second portion 19 of the seal 15 is glued to the touchpad 3. Thus, the first portion 19 of the seal 15 offers a seal-tightness between the display screen 2 and the touchpad 3.

FIG. 7a represents a schematic front view of an alternative embodiment of a control and display module 1 for motor vehicles in which the module 1 comprises different touch control areas (delimited by dotted lines). In addition to the touch area corresponding to the display screen 2, the module 1 also comprises touch areas 6a to 6f making it possible to simulate control knobs. These areas can, for example, be backlit to be viewed while driving by day or by night and give the illusion that they are fully integrated in the module 1.

Furthermore, these touch control areas 6a-6f do not have a display screen behind the touchpad, which makes it possible to significantly reduce the costs, while being transparent to the user. Thus, by applying a black tint such as the opaque tint 24 presented in FIG. 5 to all of the protective film except the display screen 2 and the backlit control areas 6a-6f, a front control surface is obtained that is smooth, revealing the image of the display screen and the backlit knobs as represented in FIG. 7b. Furthermore, in such a configuration, the casing 5 is extended toward the touch control areas 6a-6f so as to produce a rigid support block for the equipment items associated with these touch control areas 6a-6f.

Thus, the different embodiments of the present invention make it possible to obtain a display screen 2 that is held in position even in the case of impacts or vibrations while guaranteeing a seal-tightness between the display screen 2 and the touchpad 3. Furthermore, the distance between the display surface of the display screen 2 and the front control surface 4 is reduced which ensures a good display quality for the user.

The invention claimed is:

1. A control and display module for motor vehicles comprising:
   a display screen for displaying data;
   a touchpad intended for the input of commands by a user, said touchpad at least partially overlaying said display screen;
   a casing in which said display screen and said touchpad are housed, said casing comprising a front frame, wherein
   the casing has an internal rim protruding between the display screen and the touchpad, said internal rim holding the display screen in position in the casing; and
   a seal of which a first portion is inserted between the internal rim of the casing and the display screen and a second portion extends beyond the internal rim toward the center of the display screen.

2. The control and display module as claimed in claim 1, wherein the second portion of the seal extending beyond the internal rim links the display screen and the touchpad in a seal-tight manner.

3. The control and display module as claimed in claim 1, further comprising an additional seal, of which a first portion is inserted between the touchpad and the internal rim of the casing and a second portion extends beyond the internal rim toward the center of the display screen, the second portions of the seal and of the additional seal cooperating to link the display screen and the touchpad in a seal-tight manner.

4. The control and display module as claimed in claim 3, wherein the seal and/or the additional seal comprises a flexible material with closed cells.

5. The control and display module as claimed in claim 3, wherein the seal and/or the additional seal comprises a flexible material with open cells.

6. The control and display module as claimed in claim 3, wherein the seal and/or the additional seal comprises a polyethylene foam.

7. The control and display module as claimed in claim 3, wherein the seal and/or the additional seal comprises an elastomer of ethylene-propylene-diene monomer (EPDM) type.

8. The control and display module as claimed in claim 3, wherein the seal and/or the additional seal is bi-adhesive.

9. The control and display module as claimed in claim 3, wherein the length of the first portion and the second portion of the seal and/or of the additional seal is between 2 and 5 millimeters.

10. The control and display module as claimed in claim 3, wherein the first portion of the seal and/or of the additional seal is compressed by at least 50% of its initial thickness without stress.

11. The control and display module as claimed in claim 3, wherein the seal and/or the additional seal is two-staged so that the first and the second portions of the seal and/or of the additional seal have different thicknesses.

12. The control and display module as claimed in claim 1, further comprising a protective film fixed to the outer edges of the front frame of the casing and behind which the touchpad is fixed.

13. The control and display module as claimed in claim 12, wherein the fixing between the protective film and the touchpad is produced by gluing.

14. The control and display module as claimed in claim 12, wherein the protective film comprises a local opaque tint to mask at least the internal rim of the casing from the user.

15. The control and display module as claimed in claim 1, wherein the touchpad is a capacitive pad.

16. The control and display module as claimed in claim 1, wherein the internal rim of the casing is formed by a metallic insert fixed to the casing.

* * * * *